United States Patent [19]
Nakamura et al.

[11] Patent Number: 5,098,534
[45] Date of Patent: Mar. 24, 1992

[54] COMPOSITION AND METHOD FOR ELECTROLYTICALLY STRIPPING SILVER

[75] Inventors: Taichi Nakamura; Yuuji Shimomura, both of Hirakata, Japan

[73] Assignee: C. Uyemura & Co., Ltd., Osaka, Japan

[21] Appl. No.: 684,320

[22] Filed: Apr. 12, 1991

[51] Int. Cl.⁵ .............................................. C25F 5/00
[52] U.S. Cl. .................................................... 204/146
[58] Field of Search ........................................ 204/146

[56] References Cited
FOREIGN PATENT DOCUMENTS 141599 11/1980 Japan .
1-56500  6/1989 Japan .
2-104699 4/1990 Japan .

Primary Examiner—T. M. Tufariello
Attorney, Agent, or Firm—Birch, Stewart, Kolasch & Birch

[57] ABSTRACT

A composition comprising succinimide and/or phthalimide and an alkali metal hydroxide is effective for electrolytically stripping silver. Unnecessary silver coating portions can be electrolytically stripped from a silver-plated article by immersing the article in a solution of the stripping composition, and applying voltage to effect electrolytic stripping.

5 Claims, 1 Drawing Sheet

COMPOSITION AND METHOD FOR ELECTROLYTICALLY STRIPPING SILVER

This invention relates to a composition and method for electrolytically stripping silver, and more particularly, to a composition and method for electrolytically stripping unnecessary silver coatings on copper or copper alloy substrates.

BACKGROUND OF THE INVENTION

Electronic parts such as lead frames and connector pins are often subject to partial silver plating. Sometimes, silver coatings are deposited beyond the necessary regions to be plated. It is then required to strip and remove extra portions of the silver coating extending beyond the necessary regions. It is also a common practice to form patterned silver coatings by plating silver on a wider article area and then stripping unnecessary silver coating portions while retaining necessary silver coating portions.

Overcoating, that is, deposition of silver coatings outside the predetermined region often occurs during silver strike plating. More particularly, in silver plating on copper or copper alloy substrates, the adhesion between the silver coating and the substrates can be enhanced by carrying out silver strike plating in a bath having a low silver concentration and a high cyanide concentration prior to silver plating in a conventional silver plating bath. Since the strike plating bath has high penetrating power, silver coatings are often deposited on the unnecessary regions despite masking. One way for restricting such overcoating is to eliminate the silver strike plating, but without silver strike plating, the adhesion between the silver coating and the underlying substrates remains low.

In stripping silver coatings, it is desired that the underlying metal such as copper or copper alloys be not attacked or deteriorated in outer appearance. Another attempt is made for stripping unnecessary portions of a silver coating by exposing the overall silver coating to a stripping solution without masking the necessary portions. In this attempt, since the necessary portions of the silver coating are partially removed, it is desired that the necessary portions of the silver coating be attacked or deteriorated in outer appearance as scarcely as possible.

Prior art solutions for electrolytically stripping silver coatings include concentrated sulfuric acid having NaNO$_3$ added thereto, solutions based on potassium or sodium cyanide, and solutions based on sodium thiosulfate. All these solutions suffer from problems that they etch the underlying metal such as copper and copper alloys, cause gloss variations or deterioration or satinizing on the necessary silver coating portions, and deteriorate the appearance of the underlying metal or the necessary silver coating portions. Use of dangerous concentrated sulfuric acid and toxic cyanides is also undesirable.

SUMMARY OF THE INVENTION

The present invention has been made to overcome the above-mentioned problems of the prior art and its object is to provide an improved composition and method for electrolytically stripping unnecessary silver coating portions from a silver-plated article of a metal such as copper and copper alloys in an efficient manner while minimizing the risk of etching the underlying metal or deteriorating the outer appearance of the necessary silver coating portions.

The inventors have discovered that an electrolytic stripping composition comprising succinimide and/or phthalimide and a conductive agent in the form of an alkali metal hydroxide, typically NaOH, is effective for stripping unnecessary portions from a silver coating without etching the underlying metal such as copper and copper alloys and deteriorating the appearance of the necessary silver coating portions. Since this stripping composition is free of conc. sulfuric acid or cyanides, it is safe and easy in process control and maintenance.

Therefore, the present invention provides a composition for electrolytically stripping silver predominantly comprising succinimide and/or phthalimide and an alkali metal hydroxide.

Also, the present invention provides a method for electrolytically stripping silver from a silver-plated article, comprising the steps of: immersing the article in a solution of the stripping composition defined above, and applying a predetermined voltage between the article as an anode and a cathode, thereby electrolytically stripping unnecessary silver coating portions.

BRIEF DESCRIPTION OF THE DRAWINGS

The above and other objects, features, and advantages of the present invention will be better understood from the following description taken in conjunction with the accompanying drawings, in which.

DESCRIPTION OF THE PREFERRED EMBODIMENTS

Figure 1:
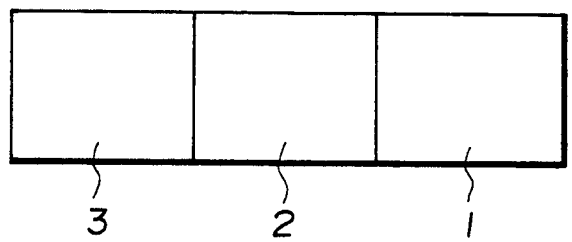
FIGS. 1 and 2 are plane and cross-sectional views of a test plaque used in the experiment of Example 1.

As defined above, the stripping composition of the invention uses at least one complexing agent selected from succinimide and phthalimide and an electrical conductive agent selected from alkali metal hydroxides such as NaOH, KOH and LiOH. The amount of succinimide and phthalimide used is not particularly limited although each complexing agent is preferably used in an amount of 10 to 100 grams/liter, more preferably 30 to 60 grams/liter. Also, the amount of alkali metal hydroxide used is not particularly limited although it is preferably used in an amount of 3 to 12 grams/liter for preventing the risk of etching or inviting gloss variations on the underlying metal during electrolytic stripping. The stripping composition of the invention is used as a solution in water and preferably adjusted to pH 6 to 9.5. Stripping solutions at a too low pH level would adversely affect the gloss of necessary silver coating portions which are rendered blackish.

In addition to the complexing and conductive agents, the stripping composition of the invention may contain any other additives, if desired, for example, a pH buffer agent for reducing pH variation. The pH buffer agent which is capable of buffering the solution in the desired pH range includes boric acid, potassium borate and sodium borate and is used in an amount of 50 grams/liter or less.

The stripping composition is used for removal of silver coatings. A silver-plated metal article, from which the silver coating is to be removed partially or entirely, is immersed in a solution of the stripping composition. A cathode is opposed to the article which is made anode. A predetermined voltage is applied between the article and the cathode to effect electrolytic stripping.

The metal underlying the silver coating is preferably copper, copper alloys, iron-nickel alloys, steel, stainless steel or the like.

The electrolytic conditions may be suitably chosen although the preferred set of conditions includes a voltage of 3 to 15 V, an anodic current density of 0.1 to 5 A/dm$^2$, and a temperature of from room temperature to 50° C. It is to be noted that the cathode may be formed of any desired material although stainless steel is often used. The time taken for electrolytic stripping depends on the thickness of the silver coating to be stripped, current density, voltage and the like, although the stripping time is usually about 3 to 8 seconds for a coating thickness resulting from silver strike plating and about 60 seconds for a thickness of about 2 μm.

When it is desired to partially strip the silver coating from the silver plated article, the necessary portion of the silver coating which should be retained may be protected by masking or only the unnecessary portion of the silver coating which should be removed may be immersed in the stripping solution. If the unnecessary silver coating portion is thin and the necessary silver coating portion is enough thick so that the necessary portion may be removed by a thickness corresponding to the unnecessary portion without a significant problem, then the entire article including the necessary silver coating portion can be immersed in the stripping solution.

EXAMPLE

Examples of the present invention are given below by way of illustration and not by way of limitation.

EXAMPLE 1

Figure 2:
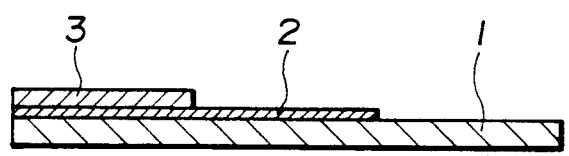

A test plaque was prepared as shown in FIGS. 1 and 2 by starting with a copper plate 1 of 20 mm wide and 75 mm long which had been bright polished. Silver strike plating was effected at a current density Dk of 0.4 A/dm$^2$ for 30 seconds to deposit a silver strike plating film 2 of about 0.05 μm thick on a section of the copper plate 1. Next, bright silver cyanide plating was effected to form a bright silver plating film 3 of about 2 μm thick on a section of the silver strike plating film 2.

Consequently, the test plaque had exposed sections of the copper surface, silver strike plating film, and silver plating film.

The test plaque was entirely immersed in an electrolytic stripping solution of the following composition where electrolytic stripping was carried out under the following conditions.

| Stripping composition and conditions | |
| --- | --- |
| Succinimide | 45 grams/liter |
| Potassium hydroxide | 7 grams/liter |
| pH | 9.3 |
| Voltage | 4 V |
| Anodic current density | 2 A/dm$^2$ |
| Temperature | 35° C. |
| Time | 5 sec. |

It was found that the exposed section of silver strike plating was completely removed, the surface of the bright silver plating maintained the original gloss and experienced no discoloration, and the exposed section of the copper plate maintained the original gloss without etching.

EXAMPLE 2

Figure 3:
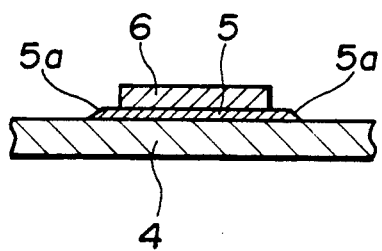
FIG. 3 is a partial cross-sectional view of a test plaque used in the experiment of Example 2.

A test plaque was prepared as shown in FIG. 3 by effecting successive partial silver plating on a lead frame 4 of a copper alloy to form a silver strike plating film 5 and a silver plating film 6 thereon such that the lower film 5 is peripherally exposed outside the upper film 6. The test plaque was immersed in a solution of the following composition where electrolytic stripping was carried out under the following conditions to remove an exposed portion 5a of the silver strike plating film 5.

| Stripping composition and conditions | |
| --- | --- |
| Phthalimide | 60 grams/liter |
| Potassium hydroxide | 7 grams/liter |
| Potassium borate | 20 grams/liter |
| pH | 9.5 |
| Voltage | 4 V |
| Anodic current density | 2 A/dm$^2$ |
| Temperature | 30° C. |
| Time | 30 sec. |

It was found that the exposed silver portion 5a was completely removed while the necessary silver plating film and the substrate had a satisfactory appearance without etching of the substrate.

There has been described a composition and method for electrolytically stripping unnecessary silver coating portions without etching the underlying metal such as copper and copper alloy and the necessary silver coating portions and without causing discoloration and gloss variation. Because of eliminated use of dangerous or toxic chemical substances, the composition is safe and easy to control the process.

Although the invention has been described for the removal of unnecessary silver coating portions from silver-plated articles, the invention is equally applicable to salvage of silver-plated articles.

Although some preferred embodiments have been described, many modifications and variations may be made thereto in the light of the above teachings. It is therefore to be understood that within the scope of the appended claims, the invention may be practiced otherwise than as specifically described.

We claim:

1. A composition for electrolytically stripping silver predominantly comprising at least one member selected from succinimide and phthalimide, and an alkali metal hydroxide.

2. The composition of claim 1 which, in an aqueous solution form, contains 10 to 100 grams of succinimide or phthalimide and 3 to 12 grams of the alkali metal hydroxide per liter of the solution.

3. The composition of claim 2 wherein the solution is at pH 6 to 9.5.

4. The composition of claim 1 or 3 which further comprises a pH buffer agent.

5. A method for electrolytically stripping silver from a silver-plated article, comprising the steps of:
   immersing the article in a solution containing at least one member selected from succinimide and phthalimide, and an alkali metal hydroxide, and
   applying a predetermined voltage between the article as an anode and a cathode, thereby electrolytically stripping unnecessary silver coating portions.

* * * * *